United States Patent
Lin et al.

(10) Patent No.: US 11,979,144 B2
(45) Date of Patent: May 7, 2024

(54) DRIVING CIRCUIT FOR DRIVING CHIP

(71) Applicant: SUZHOU NOVOSENSE MICROELECTRONICS CO., LTD., Suzhou (CN)

(72) Inventors: Tao Lin, Suzhou (CN); Shaoyu Ma, Suzhou (CN); Yun Sheng, Suzhou (CN)

(73) Assignee: SUZHOU NOVOSENSE MICROELECTRONICS CO., LTD., Suzhou (CN)

( * ) Notice: Subject to any disclaimer, the term of this patent is extended or adjusted under 35 U.S.C. 154(b) by 187 days.

(21) Appl. No.: 17/775,223

(22) PCT Filed: Nov. 12, 2020

(86) PCT No.: PCT/CN2020/128262
§ 371 (c)(1),
(2) Date: May 6, 2022

(87) PCT Pub. No.: WO2022/041495
PCT Pub. Date: Mar. 3, 2022

(65) Prior Publication Data
US 2022/0393678 A1 Dec. 8, 2022

(30) Foreign Application Priority Data
Aug. 25, 2020 (CN) .......................... 202010860622.7

(51) Int. Cl.
*H03K 17/687* (2006.01)
*H02M 1/088* (2006.01)

(52) U.S. Cl.
CPC ........ *H03K 17/6871* (2013.01); *H02M 1/088* (2013.01)

(58) Field of Classification Search
CPC ......... H03K 17/6871; H03K 17/04123; H03K 2217/0063; H03K 2217/0081; H02M 1/088; H02M 1/0006; H02M 3/158
See application file for complete search history.

(56) References Cited

U.S. PATENT DOCUMENTS

| 5,270,588 A | 12/1993 | Choi |
| 2021/0247794 A1* | 8/2021 | Tanaka .................... G05F 3/262 |

FOREIGN PATENT DOCUMENTS

| CN | 106230416 A | 12/2016 |
| CN | 106921284 A | 7/2017 |

(Continued)

*Primary Examiner* — Metasebia T Retebo
(74) *Attorney, Agent, or Firm* — Cheng-Ju Chiang

(57) ABSTRACT

The present invention provides a driving circuit for a driving hip. The driving circuit includes a bootstrap circuit with a bootstrap voltage terminal. A power terminal of a high-voltage driving circuit is connected to the bootstrap voltage terminal, and a ground terminal of the high-voltage driving circuit is connected to a regulating terminal. A high-side drive circuit includes a high-side pull-up circuit and a high-side pull-down circuit. The driving circuit includes: an auxiliary power terminal; a mirror current source an input terminal of the mirror current source being connected to the bootstrap voltage terminal; a first MOS transistor; a second MOS transistor an equivalent diode component, an output terminal of the second MOS transistor being connected to the regulating terminal through the equivalent diode component; and an equivalent resistance component, the gate of the first MOS transistor being connected to the regulating terminal through the equivalent resistance component.

10 Claims, 3 Drawing Sheets

(56) References Cited

FOREIGN PATENT DOCUMENTS

| | | |
|---|---|---|
| CN | 206807279 U | 12/2017 |
| CN | 108809061 A | 11/2018 |
| CN | 108809063 A | 11/2018 |

* cited by examiner

DRIVING CIRCUIT FOR DRIVING CHIP

CROSS REFERENCE TO RELATED APPLICATIONS

The present application is a 35 U.S.C. § 371 National Phase conversion of International (PCT) Patent Application No. PCT/CN2020/128262, filed on Nov. 12, 2020, which claims priority to Chinese Patent Application No. 202010860622.7, filed on Aug. 25, 2020, and titled "DRIVING CIRCUIT FOR DRIVING CHIP", which is incorporated herein by reference in its entirety. The PCT International Patent Application was filed and published in Chinese.

TECHNICAL FIELD

The present invention relates to the field of high-voltage driving chips, and more particularly to a driving circuit for driving chips.

BACKGROUND

As shown in FIG. 1, it is a common driving circuit structure of a half-bridge driving chip, which includes a pull-up high-voltage power transistor Q1, a pull-down high-voltage power transistor Q2, a high-voltage power terminal HV_PVIN, a voltage source MV_PVIN, a ground terminal PVSS and a regulating terminal SW. An input terminal of the pull-up high-voltage power transistor Q1 is connected to the high-voltage power terminal HV_PVIN, an output terminal of the transistor Q1 is connected to the regulating terminal SW. An input terminal of the pull-down high-voltage power transistor Q2 is connected to the regulating terminal SW, and an output terminal of the transistor Q2 is connected to the ground terminal PVSS. The driving circuit further includes a bootstrap circuit, a high-side drive circuit 10 and a low-side drive circuit 20. An output terminal (output) of the low-side drive circuit 20 is connected to a control terminal of the pull-down high-voltage power transistor Q2, and a power terminal (power) and a ground terminal (ground) of the low-side drive circuit 20 are respectively connected to two terminals of the voltage source MV_PVIN. An output terminal (output) of the high-side drive circuit 10 is connected to a control terminal of the pull-up high-voltage power transistor Q1. The bootstrap circuit includes a bootstrap voltage terminal Vboot, a power terminal (power) of the high-side drive circuit 10 is connected to the bootstrap voltage terminal Vboot, and a ground terminal (ground) of the high-side drive circuit 10 is connected to the regulating terminal SW. The bootstrap circuit usually further includes a capacitor C1 and a diode D1. An anode of the diode D1 is connected to the bootstrap voltage terminal Vboot, a cathode of the diode D1 is connected to the power terminal of the low-side drive circuit 20, and the capacitor C1 is connected between the bootstrap voltage terminal Vboot and the regulating terminal SW. Therefore, the pull-up high-voltage power transistor Q1 and the pull-down high-voltage power transistor Q2 may be respectively turned on by driving the high-side drive circuit 10 and the low-side drive circuit 20 respectively, so that the regulating terminal SW oscillates back and forth between the high-voltage power terminal HV_PVIN and the ground terminal PVSS to generate a bootstrap voltage and gradually increases a voltage of the bootstrap voltage terminal Vboot. The high-side drive circuit 10 includes a high-side pull-up circuit and a high-side pull-down circuit.

However, when the whole system is turned on, the regulating terminal SW needs to be pulled down to the ground terminal PVSS several times, and the diode D1 repeatedly charges the capacitor C1, so that a voltage of the bootstrap voltage terminal Vboot may slowly rise from zero to a voltage close to that of the voltage source MV_PVIN. During a turn-on process, when a voltage of the regulating terminal SW drops rapidly, the driving capability of the high-side pull-down circuit is insufficient. Reasons such as the insufficient power supply of the high-side drive circuit 10, insufficient turn-off capability of the pull-up high-voltage power transistor Q1 or the too slow power-on speed of an internal drive circuit, may easily lead to mistaken turn-on of the pull-up high-voltage power transistor Q1. As a result, the pull-up high-voltage power transistor Q1 and the pull-down high-voltage power transistor Q2 are turned on at the same time, and a separate power transistor outside the chip is burned out.

Therefore, in the prior art, in order to solve the above problems, an operational amplifier and a PMOS transistor are configured as a power supply circuit, and a drain of the PMOS transistor is connected to the high-side pull-down circuit. In this way, when a voltage of the bootstrap voltage terminal Vboot rises slowly, a voltage of an auxiliary power terminal at the drain of the PMOS transistor is made close to the voltage of the bootstrap voltage terminal Vboot, thereby solving the problem of insufficient driving capability of the pull-down circuit when the voltage of the bootstrap voltage terminal Vboot is low.

However, in this scheme, limited by the loop bandwidth of the operational amplifier, a response speed is relatively slow. There is an obvious delay from the power-on of the bootstrap voltage terminal Vboot to the auxiliary power terminal following the voltage of the bootstrap voltage terminal Vboot. The delay is usually several microseconds to tens of microseconds, and during this period, there is still a problem of insufficient pull-down capability of the high-side drive circuit 10.

Alternatively, in another solution in the prior art, a source follower is provided as an auxiliary power terminal to supply power to the high-side pull-down circuit, and a Zener diode is used as a reference voltage at the same time. In this way, an overall response speed is fast, so as to solve the problem of mistaken turn-on of the pull-up high-voltage power transistor Q1.

However, in this solution, providing the source follower may cause the voltage of the auxiliary power terminal to be lower than the voltage of the bootstrap voltage terminal Vboot by least one threshold voltage Vth. Therefore, when the voltage of the bootstrap voltage terminal Vboot is low or has a slow rising speed, there is still a problem of insufficient pull-down capability of a high-side driving chip and the problem of mistaken turn-on of the pull-up high-voltage power transistor Q1.

Therefore, it is necessary to design a novel driving circuit for a driving chip that is capable of solving the problem of mistaken turn-on of the pull-up high-voltage power transistor Q1 thoroughly.

SUMMARY

In order to solve one of the above problems, the present invention provides a driving circuit for a driving chip, comprising a pull-up high-voltage power transistor, a pull-down high-voltage power transistor, a high-voltage power terminal, a voltage source, a ground terminal and a regulating terminal, wherein an input terminal of the pull-up high-voltage power transistor is connected to the high-voltage power terminal, an output terminal of the pull-up high-voltage power transistor is connected to the regulating terminal, an input terminal of the pull-down high-voltage power transistor is connected to the regulating terminal, and an output terminal of the pull-down high-voltage power transistor is connected to the ground terminal;

the driving circuit further comprises a bootstrap circuit, a high-side drive circuit and a low-side drive circuit, wherein an output terminal of the low-side drive circuit is connected to a control terminal of the pull-down high-voltage power transistor, and a power terminal and a ground terminal of the low-side drive circuit are respectively connected to two terminals of the voltage source; an output terminal of the high-side drive circuit is connected to a control terminal of the pull-up high-voltage power transistor; the bootstrap circuit comprises a bootstrap voltage terminal, a power terminal of the high-side drive circuit is connected to the bootstrap voltage terminal, and a ground terminal of the high-side drive circuit is connected to the regulating terminal; and the driving circuit is characterized in that: the high-side drive circuit comprises a high-side pull-up circuit and a high-side pull-down circuit, and the driving circuit comprises:

an auxiliary power terminal configured for driving the high-side pull-down circuit;

a mirror current source, an input terminal of the mirror current source being connected to the bootstrap voltage terminal;

a first MOS transistor, an input terminal of the first MOS transistor being connected to the bootstrap voltage terminal, an output terminal of the first MOS transistor being connected to the auxiliary power terminal, and a gate of the first MOS transistor being connected to an output terminal of the mirror current source;

a second MOS transistor, an input terminal of the second MOS transistor being connected to the output terminal of the mirror current source, and a gate of the second MOS transistor being connected to the auxiliary power terminal;

an equivalent diode component, an output terminal of the second MOS transistor being connected to the regulating terminal through the equivalent diode component; and an equivalent resistance component, the gate of the first MOS transistor being connected to the regulating terminal through the equivalent resistance component.

As a further improvement of the present invention, the first MOS transistor is a PMOS transistor, and the second MOS transistor is an NMOS transistor.

As a further improvement of the present invention, the equivalent diode component comprises a third MOS transistor and a fourth MOS transistor, an input terminal and a gate of the third MOS transistor are interconnected and are connected to the output terminal of the second MOS transistor, an input terminal and a gate of the fourth MOS transistor are interconnected and are connected to an output terminal of the third MOS transistor, and an output terminal of the fourth MOS transistor is connected to the regulating terminal.

As a further improvement of the present invention, the third MOS transistor and the fourth MOS transistor are both NMOS transistors.

As a further improvement of the present invention, the equivalent resistor component is a first resistor with a constant resistance value.

As a further improvement of the present invention, the equivalent resistance component comprises a fifth MOS transistor and an external voltage connected to a gate of the fifth MOS transistor, an input terminal of the fifth MOS transistor is connected to the gate of the first MOS transistor, and an output terminal of the fifth MOS transistor is connected to the regulating terminal.

As a further improvement of the present invention, the fifth MOS transistor is an NMOS transistor.

As a further improvement of the present invention, the mirror current source comprises a sixth MOS transistor and a seventh MOS transistor, gates of the sixth MOS transistor and the seventh MOS transistor are interconnected, both input terminals of the sixth MOS transistor and the seventh MOS transistor are connected to the bootstrap voltage terminal, an output terminal of the sixth MOS transistor is connected to the gate of the first MOS transistor, and an output terminal of the seventh MOS transistor is connected to the input terminal of the second MOS transistor; and the gate and the output terminal of the seven MOS transistor are interconnected.

As a further improvement of the present invention, the sixth MOS transistor and the seventh MOS transistor are both PMOS transistors.

As a further improvement of the present invention, the driving circuit further comprises a second resistor, one terminal of the second resistor is connected to the regulating terminal, and the other terminal of the second resistor is connected to the output terminal of the first MOS transistor.

Compared with the prior art, in the present invention, when the driving circuit is turned on, the equivalent resistance component pulls down a gate voltage of the first MOS transistor, so that the first MOS transistor is turned on, and a voltage of the auxiliary power terminal can begin to follow quickly from a very low voltage of the bootstrap voltage terminal, so as to provide a power voltage which is sufficiently high to the high-side pull-down circuit. The equivalent diode component has a threshold voltage, and generates a reference voltage on the output terminal side of the second MOS transistor. When the voltage of the auxiliary power terminal is higher than the reference voltage by one turn-on threshold voltage, the second MOS transistor is turned on, so that the mirror current source starts to work, and the gate voltage of the first MOS transistor is regulated. In this way, in a steady state, the voltage of the auxiliary power terminal is regulated to a voltage which is higher than the reference voltage by about one turn-on threshold voltage. Therefore, regardless of whether the bootstrap voltage terminal operates in a fast power-on manner or in a slow power-on manner, a sufficient voltage can be generated at the auxiliary power terminal to drive the high-side pull-down circuit, thereby greatly enhancing the reliability of the chip, which effectively protects the pull-up high-voltage power transistor and the pull-down high-voltage power transistor from being burned out.

DETAILED DESCRIPTION

In order to make those skilled in the art better understand the technical solutions of the present invention, the technical solutions in the embodiments of the present invention will be clearly and completely described below with reference to the accompanying drawings in the embodiments of the present invention. Obviously, the described embodiments are only some of the embodiments of the present invention, but not all of the embodiments. Based on the embodiments of the present invention, all other embodiments obtained by persons of ordinary skill in the art without creative efforts shall fall within the protection scope of the present invention.

Figure 1:
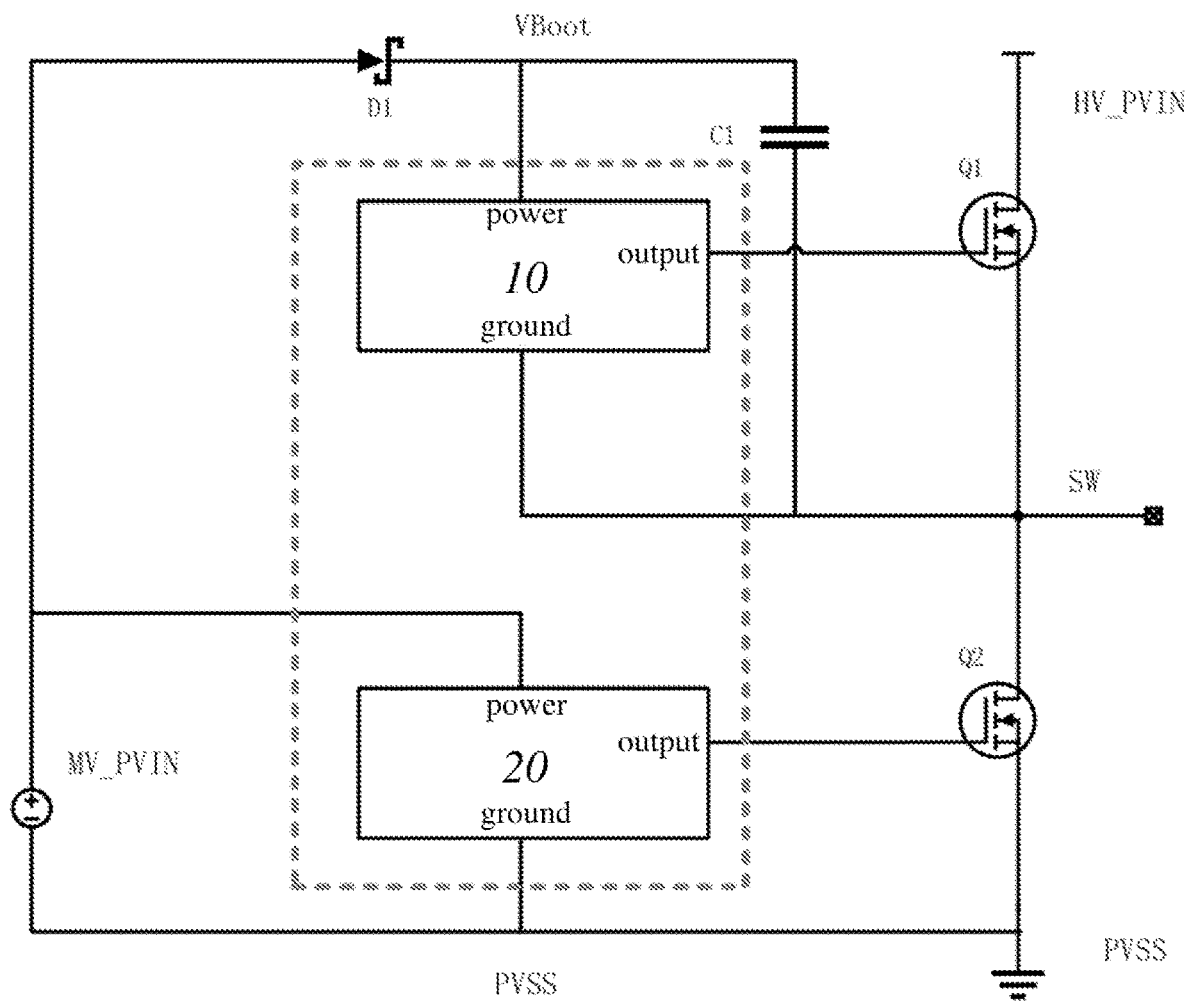
FIG. 1 is a circuit diagram of a common driving circuit structure used as a partial circuit diagram of a driving circuit of the present invention.
Figure 2:
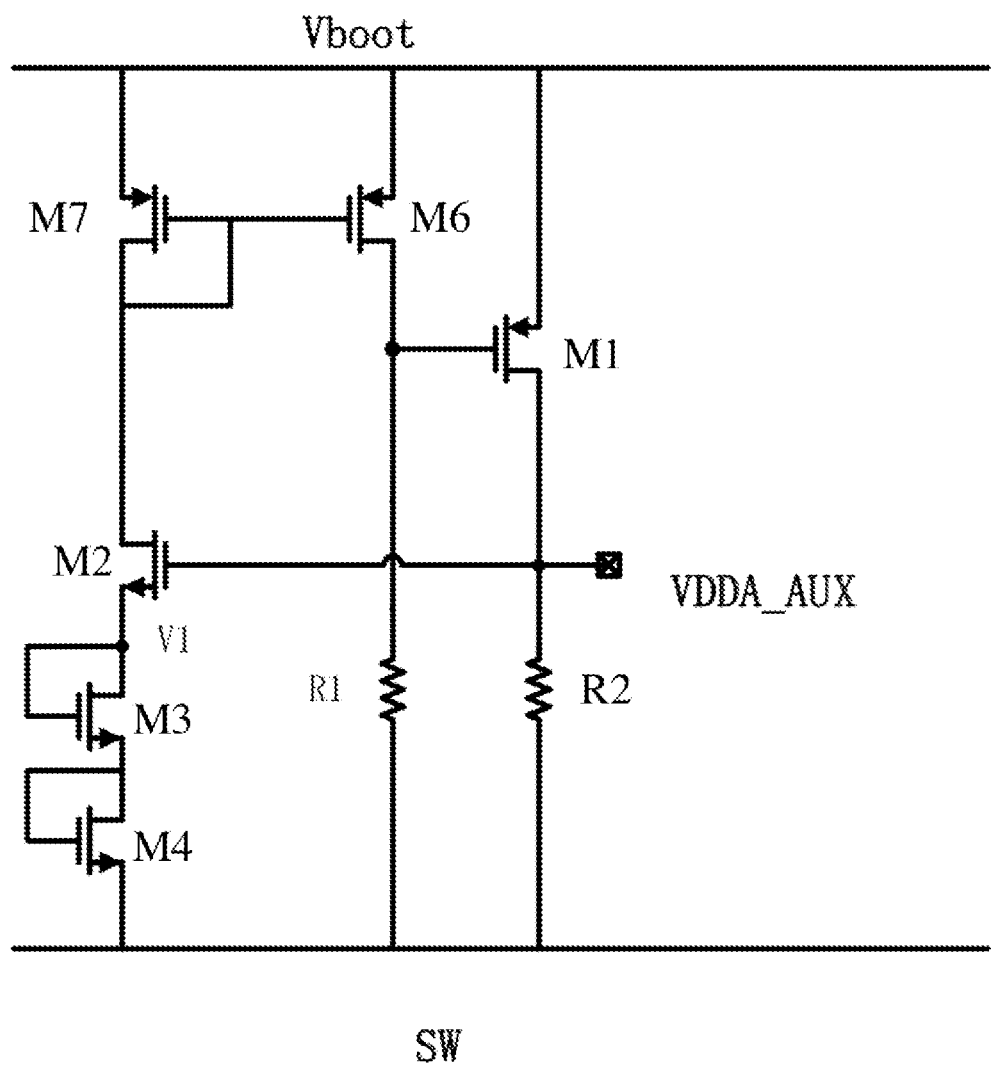
FIG. 2 is a circuit diagram of a partial structure of a driving circuit according to a first embodiment of the present invention.
Figure 3:
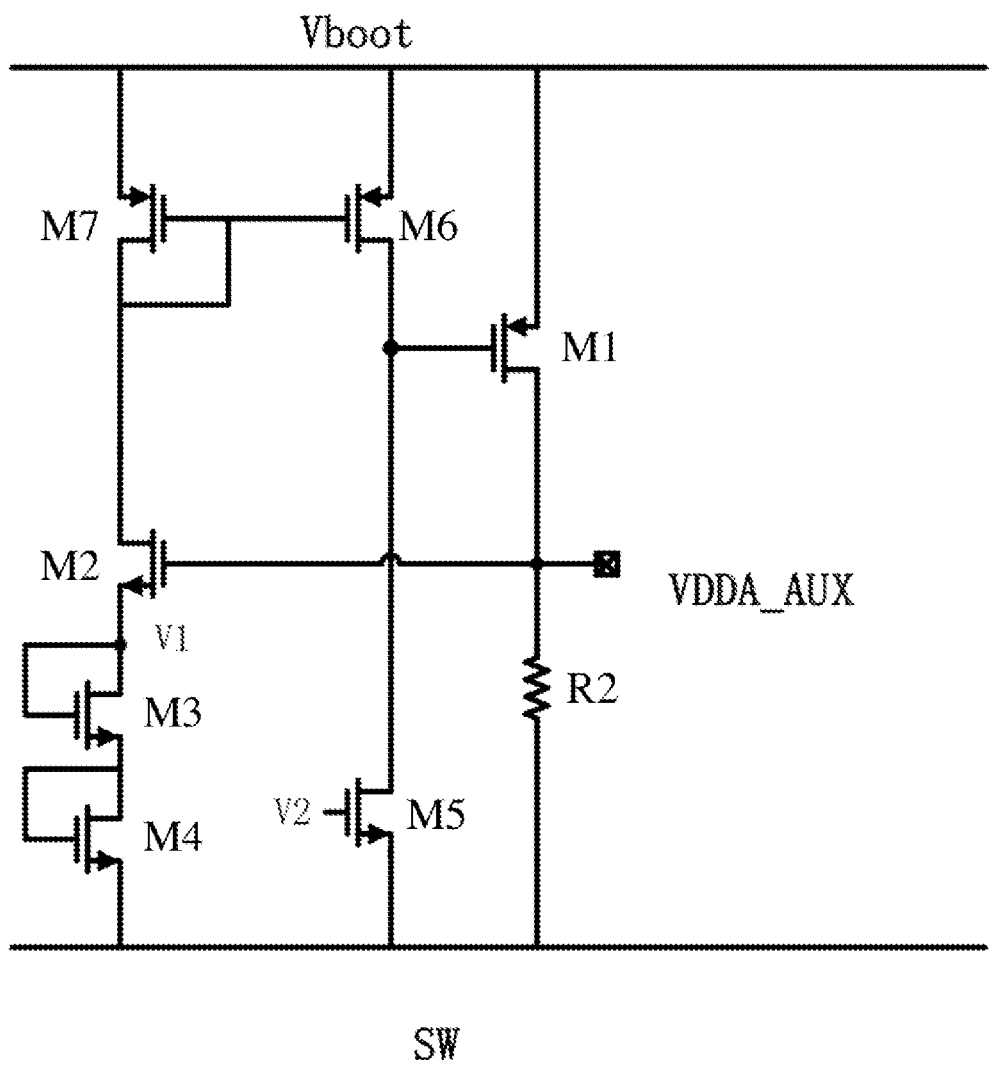
FIG. 3 is a circuit diagram of a partial structure of a driving circuit according to a second embodiment of the present invention.

As shown in FIG. 1 to FIG. 3, the present invention provides a driving circuit for a driving chip. As shown in FIG. 1, the driving circuit includes a pull-up high-voltage power transistor Q1, a pull-down high-voltage power transistor Q2, a high-voltage power terminal HV_PVIN, a voltage source MV_PVIN, a ground terminal PVSS and a regulating terminal SW. An input terminal of the pull-up high-voltage power transistor Q1 is connected to the high-voltage power terminal HV_PVIN, an output terminal of the transistor Q1 is connected to the regulating terminal SW; and an input terminal of the pull-down high-voltage power transistor Q2 is connected to the regulating terminal SW, and an output terminal of the transistor Q2 is connected to the ground terminal PVSS.

The driving circuit further includes a bootstrap circuit, a high-side drive circuit 10 and a low-side drive circuit 20. An output terminal (output) of the low-side drive circuit 20 is connected to a control terminal of the pull-down high-voltage power transistor Q2, a power terminal (power) and a ground terminal (ground) of the low-side drive circuit 20 are respectively connected to two terminals of the voltage source MV_PVIN, and an output terminal (output) of the high-side drive circuit 10 is connected to a control terminal of the pull-up high-voltage power transistor Q1. The bootstrap circuit further includes a bootstrap voltage terminal Vboot, a power terminal (power) of the high-side drive circuit 10 is connected to the bootstrap voltage terminal Vboot, and a ground terminal (ground) of the high-side drive circuit 10 is connected to the regulating terminal SW.

The bootstrap circuit further includes a capacitor C1 and a diode D1. The diode D1 is a Zener diode, an anode of the diode D1 is connected to the bootstrap voltage terminal Vboot, a cathode of the diode D1 is connected to the power terminal of the low-side drive circuit 20, and the capacitor C1 is connected between the bootstrap voltage terminal Vboot and the regulating terminal SW. Therefore, the pull-up high-voltage power transistor Q1 and the pull-down high-voltage power transistor Q2 may be respectively turned on by driving the high-side drive circuit 10 and the low-side drive circuit 20 respectively, so that the regulating terminal SW oscillates back and forth between the high-voltage power terminal HV_PVIN and the ground terminal PVSS to generate a bootstrap voltage and gradually increases a voltage of the bootstrap voltage terminal Vboot.

Specifically, the pull-up high-voltage power transistor Q1 and the pull-down high-voltage power transistor Q2 are high-voltage power transistors of off-chip separation devices. The high-voltage power terminal HV_PVIN is configured to supply power to the pull-up high-voltage power transistor Q1 and the pull-down high-voltage power transistor Q2, and the high-voltage power terminal HV_PVIN is about 100V to 800V. When the pull-up high-voltage power transistor Q1 is turned on, the voltage of the regulating terminal SW is pulled up to the voltage of the high-voltage power terminal HV_PVIN; and when the pull-down high-voltage power transistor Q2 is turned on, the voltage of the regulating terminal SW is pulled down to the ground terminal PVSS. The pull-up high-voltage power transistor Q1 and the pull-down high-voltage power transistor Q2 may not be turned on at the same time.

The capacitor C1 and the diode D1 form a bootstrap circuit, and a bootstrap voltage is generated at the bootstrap voltage terminal Vboot to supply power to the high-side drive circuit 10. In a steady state, the voltage of the bootstrap voltage terminal Vboot is equal to a value acquired by subtracting the voltage drop of the diode D1 from the voltage of the voltage source MV_PVIN, wherein the voltage drop of the diode D1 is about 0.5V to 0.7V, so the voltage of the bootstrap voltage terminal Vboot is about equal to the voltage of the voltage source MV_PVIN. When the pull-up high-voltage power transistor Q1 is turned off and the pull-down high-voltage power transistor Q2 is turned on, and when the voltage of the regulating terminal SW is pulled down to the ground terminal PVSS, the diode D1 is turned on and charges the capacitor C1; and when the pull-up high-voltage power transistor Q1 is turned on and the pull-down high-voltage power transistor Q2 is turned off, and when the voltage of the regulating terminal SW is rising, the diode D1 is turned off due to the reverse bias, and the capacitor C1 is kept at a previous voltage, thereby generating a floating voltage between the bootstrap voltage terminal Vboot and the regulating terminal SW. The floating voltage is approximately equal to the voltage of the voltage source MV_PVIN, thereby supplying power to the high-side drive circuit 10.

The high-side drive circuit 10 includes a high-side pull-up circuit and a high-side pull-down circuit. During a turn-on process, when the voltage of the regulating terminal SW drops rapidly, reasons such as the insufficient power supply of the high-side drive circuit 10, insufficient turn-off capability of the pull-up high-voltage power transistor Q1 or the too slow power-on speed of an internal drive circuit, may easily lead to mistaken turn-on of the pull-up high-voltage power transistor Q1. As a result, the pull-up high-voltage power transistor Q1 and the pull-down high-voltage power transistor Q2 are turned on at the same time, and a separate power transistor outside the chip is burned out. This is caused by insufficient driving capability of the high-side pull-down circuit, so the present invention further improves the driving circuit.

The driving circuit includes:

an auxiliary power terminal VDDA_AUX configured for driving the high-side pull-down circuit;

a mirror current source, wherein an input terminal of the mirror current source is connected to the bootstrap voltage terminal Vboot;

a first MOS transistor M1, wherein an input terminal of the first MOS transistor M1 is connected to the bootstrap voltage terminal Vboot, an output terminal of the first MOS transistor M1 is connected to the auxiliary power terminal VDDA_AUX, and a gate of the first MOS transistor M1 is connected to an output terminal of the mirror current source;

a second MOS transistor M2, an input terminal of the second MOS transistor M2 is connected to the output terminal of the mirror current source, and a gate of the second MOS transistor M2 is connected to the auxiliary power terminal VDDA_AUX;

an equivalent diode component, an output terminal of the second MOS transistor M2 is connected to the regulating terminal SW through the equivalent diode component; and an equivalent resistance component, the gate of the first MOS transistor M1 is connected to the regulating terminal SW through the equivalent resistance component.

When the driving circuit is turned on, the equivalent resistance component pulls down a gate voltage of the first MOS transistor M1, so that the first MOS transistor M1 is turned on, and a voltage of the auxiliary power terminal VDDA_AUX can begin to follow quickly from a very low voltage of the bootstrap voltage terminal Vboot, so as to provide a power voltage which is sufficiently high to the high-side pull-down circuit. The equivalent diode component has a threshold voltage, and generates a reference voltage V1 on the output terminal side of the second MOS transistor M2. When the voltage of the auxiliary power terminal VDDA_AUX is higher than the reference voltage V1 by one turn-on threshold voltage Vth, the second MOS transistor M2 is turned on, so that the mirror current source starts to work, and the gate voltage of the first MOS transistor M1 is regulated. In this way, in a steady state, the voltage of the auxiliary power terminal VDDA_AUX is regulated to a voltage which is higher than the reference voltage V1 by about one turn-on threshold voltage Vth. Therefore, regardless of whether the bootstrap voltage terminal Vboot operates in a fast power-on manner or in a slow power-on manner, a sufficient voltage can be generated at the auxiliary power terminal VDDA_AUX to drive the high-side pull-down circuit, thereby greatly enhancing the reliability of the chip, which effectively protects the pull-up high-voltage power transistor Q1 and the pull-down high-voltage power transistor Q2 from being burned out.

Moreover, the second MOS transistor M2 and the equivalent resistance component constitute a single-transistor operational amplifier, which has a very high bandwidth of about tens of megahertz to hundreds of megahertz, thereby effectively solving a problem that a traditional closed-loop operational amplifier has a small bandwidth and a slow settling speed. In addition, the above solution overcomes a problem in a traditional solution that the pull-up high-voltage power transistor Q1 and the pull-down high-voltage power transistor Q2 are turned on at the same time due to mistaken output of the high-side drive circuit 10 during a settling process of the operational amplifier, which causes a power transistor to burn out.

Moreover, in this embodiment, the first MOS transistor M1 is a PMOS transistor, and the second MOS transistor M2 is an NMOS transistor. Therefore, a source of the first MOS transistor M1 is connected to the bootstrap voltage terminal Vboot, and a drain of the transistor M1 is connected to the auxiliary power terminal VDDA_AUX; and a source of the second MOS transistor M2 is connected to the equivalent diode component, and a drain of the transistor M2 is connected to the output terminal of the mirror current source.

Since the PMOS transistor is turned on at a low level and the NMOS transistor is turned on at a high level, when the driving circuit is turned on, the equivalent resistance component can pull down the gate voltage of the first MOS transistor M1, so that the first MOS transistor M1 is turned on. The NMOS transistor is turned on at a high level, so when the voltage of the auxiliary power terminal VDDA_AUX is higher than the reference voltage V1 by one turn-on threshold voltage Vth, the second MOS transistor M2 is turned on and can draw current from the current mirror.

The equivalent diode component includes a third MOS transistor M3 and a fourth MOS transistor M4. An input terminal and a gate of the third MOS transistor M3 are interconnected and are connected to the output terminal of the second MOS transistor M2, an input terminal and a gate of the fourth MOS transistor M4 are interconnected and are connected to an output terminal of the third MOS transistor M3, and an output terminal of the fourth MOS transistor M4 is connected to the regulating terminal SW. Moreover, in this embodiment, the third MOS transistor M3 and the fourth MOS transistor M4 are completely identical, so the turn-on threshold voltages Vths of the third MOS transistor M3 and the fourth MOS transistor M4 are also identical.

Specifically, since the input terminal and the gate of each of the third MOS transistor M3 and the fourth MOS transistor M4 are interconnected, the reference voltage V1 at the input terminal of the third MOS transistor M3, i.e., the reference voltage V1 at the output terminal side of the second MOS transistor M2 is twice that of the threshold voltage Vth, namely:

$$V_1 = 2 * V_{th}$$

Therefore, when the voltage of the auxiliary power terminal VDDA_AUX is higher than the reference voltage V1 by one turn-on threshold voltage Vth, the second MOS transistor M2 is turned on, and the voltage of the auxiliary power terminal VDDA_AUX is about 3*Vth. In addition, the current of the mirror current source continues to regulate the gate voltage of the first MOS transistor M1, so that in a steady state, the voltage of the auxiliary power terminal VDDA_AUX is also kept at about 3*Vth.

In this embodiment, the third MOS transistor M3 and the fourth MOS transistor M4 are both NMOS transistors. Therefore, the NMOS transistor is turned on at a high level, and can be equivalent to one diode D1 when the gate and a drain thereof are interconnected, and has a certain turn-on threshold voltage Vth. The drain and the gate of the third MOS transistor M3 are interconnected and are connected to the source of the second MOS transistor M2. The drain and the gate of the fourth MOS transistor M4 are interconnected and are connected to a source of the third MOS transistor M3, and a source of the fourth MOS transistor M4 is connected to the regulating terminal SW.

Of course, in the present invention, two MOS transistors are interconnected to form an equivalent diode component, but one or at least three MOS transistors, or diodes, or resistors, or other components may also be used to form an equivalent diode component to meet the purpose of the present invention, as long as the stable reference voltage V1 can be generated.

In the present invention, the equivalent resistance can be matched with the second MOS transistor M2 to form a single-transistor operational amplifier. After the driving circuit is turned on, the equivalent resistance component can pull down the gate voltage of the first MOS transistor M1, so that the first MOS transistor M1 works. Specifically, in the present invention, the equivalent resistance can be embodied in two embodiments.

In a first embodiment, as shown in FIG. 2, the equivalent resistance component is a first resistor R1 with a constant resistance value. Obviously, the resistance value of the first resistor R1 may not be too large, so that the gate voltage of the first MOS transistor M1 is smoothly pulled down after the driving circuit is turned on. Of course, if multiple resistors are configured in the equivalent resistance, the purpose of the present invention can also be achieved actually.

In a second embodiment, as shown in FIG. 3, the equivalent resistance component includes a fifth MOS transistor M5 and an external voltage V2 connected to a gate of the fifth MOS transistor M5. An input terminal of the fifth MOS transistor M5 is connected to the gate of the first MOS transistor M1, and an output terminal of the fifth MOS transistor M5 is connected to the regulating terminal SW.

In this embodiment, the fifth MOS transistor M5 can be configured as a variable resistor, and the fifth MOS transistor M5 is an NMOS transistor. Therefore, after the driving circuit is turned on, the voltage of the external voltage V2 can be increased, so that the fifth MOS transistor M5 is turned on to quickly pull down the gate voltage of the first MOS transistor M1; and when the voltage of the bootstrap voltage terminal Vboot is high enough, the voltage of the external voltage V2 is reduced, so that the fifth MOS transistor M5 is turned off, thereby reducing the static power consumption of the driving circuit.

Similarly, if the fifth MOS transistor M5 is a PMOS transistor, or other variable resistors, etc., the purpose of the present invention can also be achieved.

The mirror current source includes a sixth MOS transistor M6 and a seventh MOS transistor M7. Gates of the sixth MOS transistor M6 and the seventh MOS transistor M7 are interconnected, and input terminals of the transistor M6 and the transistor M7 are connected to the bootstrap voltage terminal Vboot. An output terminal of the sixth MOS transistor M6 is connected to the gate of the first MOS transistor M1, an output terminal of the seventh MOS transistor M7 is connected to the input terminal of the second MOS transistor M2, and a gate and the output terminal of the seventh MOS transistor M7 are interconnected.

In addition, specifically, the sixth MOS transistor M6 and the seventh MOS transistor M7 are both PMOS transistors.

Therefore, in fact, sources of the sixth MOS transistor M6 and the seventh MOS transistor M7 are connected to the bootstrap voltage terminal Vboot, a drain of the sixth MOS transistor M6 is connected to the gate of the first MOS transistor M1 and the equivalent resistance component, and a drain of the seventh MOS transistor M7 is connected to the drain of the second MOS transistor M2. In the present invention, though two PMOS transistors are configured to form a mirror current source, the purpose of the present invention can also be achieved if two NMOS transistors are configured.

The sixth MOS transistor M6 and the seventh MOS transistor M7 have the same drain current. Therefore, when the second MOS transistor M2 is turned on, the seventh MOS transistor M7 is turned on and forms branch current together with the second MOS transistor M2 and the equivalent diode component. The drain current of the sixth MOS transistor M6 mirrors the drain current of the seventh MOS transistor M7, and the drain current of the sixth MOS transistor M6 can regulate the gate voltage of the first MOS transistor M1. Therefore, in a steady state, the voltage of the auxiliary power terminal VDDA_AUX can be regulated to be about three times that of the threshold voltage Vth, that is, 3*Vth.

The driving circuit further includes a second resistor R2, one terminal of the second resistor R2 is connected to the regulating terminal SW, and the other terminal of the second resistor R2 is connected to the output terminal of the first MOS transistor M1. That is, one terminal of the second resistor R2 is connected to the auxiliary power terminal VDDA_AUX to form the voltage of the auxiliary power terminal VDDA_AUX on the second resistor R2.

In summary, when the driving circuit is turned on, the equivalent resistance component pulls down the gate voltage of the first MOS transistor M1, so that the first MOS transistor M1 is turned on, and the voltage of the auxiliary power terminal VDDA_AUX can begin to follow quickly from a very low voltage of the bootstrap voltage terminal Vboot, so as to provide a power voltage which is sufficiently high to the high-side pull-down circuit. The equivalent diode component has a threshold voltage, and generates a reference voltage V1 on the output terminal side of the second MOS transistor M2. When the voltage of the auxiliary power terminal VDDA_AUX is higher than the reference voltage V1 by one turn-on threshold voltage Vth, the second MOS transistor M2 is turned on, so that the mirror current source starts to work, and the gate voltage of the first MOS transistor M1 is regulated. In this way, in a steady state, the voltage of the auxiliary power terminal VDDA_AUX is regulated to a voltage which is higher than the reference voltage V1 by about one turn-on threshold voltage Vth. Therefore, regardless of whether the bootstrap voltage terminal Vboot operates in a fast power-on manner or in a slow power-on manner, a sufficient voltage can be generated at the auxiliary power terminal VDDA_AUX to drive the high-side pull-down circuit, thereby greatly enhancing the reliability of the chip, which effectively protects the pull-up high-voltage power transistor Q1 and the pull-down high-voltage power transistor Q2 from being burned out.

Moreover, the second MOS transistor M2 and the equivalent resistance component constitute a single-transistor operational amplifier, which has a very high bandwidth of about tens of megahertz to hundreds of megahertz, thereby effectively solving a problem that a traditional closed-loop operational amplifier has a small bandwidth and a slow settling speed. In addition, the above solution overcomes a problem in a traditional solution that the pull-up high-voltage power transistor Q1 and the pull-down high-voltage power transistor Q2 are turned on at the same time due to mistaken output of the high-side drive circuit 10 during a settling process of the operational amplifier, which causes a power transistor to burn out.

In addition, the first MOS transistor M1 in the present invention is a PMOS transistor and is configured to generate the voltage of the auxiliary power terminal VDDA_AUX, so the present invention adopts a form of a single-transistor operational amplifier and a PMOS transistor output stage, which effectively takes into account a low working power voltage and a high response speed, thereby greatly enhancing the stability and reliability of the chip.

In addition, it should be understood that although this specification is described in terms of embodiments, not each embodiment only includes an independent technical solution, and this description in the specification is only for the sake of clarity. Those skilled in the art should take the specification as a whole, and the technical solutions in each embodiment can also be appropriately combined to form other embodiments that can be understood by those skilled in the art.

The series of detailed descriptions listed above are only specific descriptions for the feasible embodiments of the present invention, and are not intended to limit the protection scope of the present invention. Any equivalent embodiments or changes made without departing from the technical spirit of the present invention should be encompassed within the protection scope of the present invention.

What is claimed is:

1. A driving circuit for a driving chip, comprising a pull-up high-voltage power transistor, a pull-down high-voltage power transistor, a high-voltage power terminal, a voltage source, a ground terminal and a regulating terminal, wherein an input terminal of the pull-up high-voltage power transistor is connected to the high-voltage power terminal, an output terminal of the pull-up high-voltage power transistor is connected to the regulating terminal, an input terminal of the pull-down high-voltage power transistor is connected to the regulating terminal, and an output terminal of the pull-down high-voltage power transistor is connected to the ground terminal;

the driving circuit further comprises a bootstrap circuit, a high-side drive circuit and a low-side drive circuit, wherein an output terminal of the low-side drive circuit is connected to a control terminal of the pull-down high-voltage power transistor, and a power terminal and a ground terminal of the low-side drive circuit are respectively connected to two terminals of the voltage source; an output terminal of the high-side drive circuit is connected to a control terminal of the pull-up high-voltage power transistor; the bootstrap circuit comprises a bootstrap voltage terminal, a power terminal of the high-side drive circuit is connected to the bootstrap voltage terminal, and a ground terminal of the high-side drive circuit is connected to the regulating terminal; and the driving circuit is characterized in that: the high-side drive circuit comprises a high-side pull-up circuit and a high-side pull-down circuit, and the driving circuit comprises:

an auxiliary power terminal configured for driving the high-side pull-down circuit;

a mirror current source, an input terminal of the mirror current source being connected to the bootstrap voltage terminal;

a first MOS transistor, an input terminal of the first MOS transistor being connected to the bootstrap voltage terminal, an output terminal of the first MOS transistor being connected to the auxiliary power terminal, and a gate of the first MOS transistor being connected to an output terminal of the mirror current source;

a second MOS transistor, an input terminal of the second MOS transistor being connected to the output terminal of the mirror current source, and a gate of the second MOS transistor being connected to the auxiliary power terminal;

an equivalent diode component, an output terminal of the second MOS transistor being connected to the regulating terminal through the equivalent diode component; and an equivalent resistance component, the gate of the first MOS transistor being connected to the regulating terminal through the equivalent resistance component.

2. The driving circuit according to claim 1, wherein the first MOS transistor is a PMOS transistor, and the second MOS transistor is an NMOS transistor.

3. The driving circuit according to claim 1, wherein the equivalent diode component comprises a third MOS transistor and a fourth MOS transistor, an input terminal and a gate of the third MOS transistor are interconnected and are connected to the output terminal of the second MOS transistor, an input terminal and a gate of the fourth MOS transistor are interconnected and are connected to an output terminal of the third MOS transistor, and an output terminal of the fourth MOS transistor is connected to the regulating terminal.

4. The driving circuit according to claim 2, wherein the third MOS transistor and the fourth MOS transistor are both NMOS transistors.

5. The driving circuit according to claim 1, wherein the equivalent resistor component is a first resistor with a constant resistance value.

6. The driving circuit according to claim 1, wherein the equivalent resistance component comprises a fifth MOS transistor and an external voltage connected to a gate of the fifth MOS transistor, an input terminal of the fifth MOS transistor is connected to the gate of the first MOS transistor, and an output terminal of the fifth MOS transistor is connected to the regulating terminal.

7. The driving circuit according to claim 6, wherein the fifth MOS transistor is an NMOS transistor.

8. The driving circuit according to claim 1, wherein the mirror current source comprises a sixth MOS transistor and a seventh MOS transistor, gates of the sixth MOS transistor and the seventh MOS transistor are interconnected, both input terminals of the sixth MOS transistor and the seventh MOS transistor are connected to the bootstrap voltage terminal, an output terminal of the sixth MOS transistor is connected to the gate of the first MOS transistor, and an output terminal of the seventh MOS transistor is connected to the input terminal of the second MOS transistor; and the gate and the output terminal of the seven MOS transistor are interconnected.

9. The driving circuit according to claim 8, wherein the sixth MOS transistor and the seventh MOS transistor are both PMOS transistors.

10. The driving circuit according to claim 1, wherein the driving circuit further comprises a second resistor, one terminal of the second resistor is connected to the regulating terminal, and the other terminal of the second resistor is connected to the output terminal of the first MOS transistor.

* * * * *